(12) United States Patent
Alalusi et al.

(10) Patent No.: US 8,295,320 B2
(45) Date of Patent: Oct. 23, 2012

(54) ACHIEVING LOW PHASE NOISE IN EXTERNAL CAVITY LASER IMPLEMENTED USING PLANAR LIGHTWAVE CIRCUIT TECHNOLOGY

(75) Inventors: Mazin Alalusi, Sunnyvale, CA (US); Peter Mols, Scotts Valley, CA (US); Lew Stolpner, Mt. View, CA (US)

(73) Assignee: Redfern Integrated Optics, Inc., Santa Clara, CA (US)

( * ) Notice: Subject to any disclaimer, the term of this patent is extended or adjusted under 35 U.S.C. 154(b) by 105 days.

(21) Appl. No.: 12/787,646

(22) Filed: May 26, 2010

(65) Prior Publication Data

US 2010/0303121 A1     Dec. 2, 2010

Related U.S. Application Data

(60) Provisional application No. 61/181,183, filed on May 26, 2009.

(51) Int. Cl.
*H01S 3/08*     (2006.01)
(52) U.S. Cl. ........................................... 372/92
(58) Field of Classification Search .................. 398/196; 372/92, 29.02
See application file for complete search history.

(56) References Cited

U.S. PATENT DOCUMENTS

| | | | |
|---|---|---|---|
| 5,513,196 A | 4/1996 | Bischel et al. | |
| 6,920,159 B2 | 7/2005 | Sidorin et al. | |
| 2004/0213317 A1* | 10/2004 | Hashimoto et al. | 372/102 |
| 2004/0252733 A1 | 12/2004 | Huang | |
| 2006/0002443 A1* | 1/2006 | Farber et al. | 372/50.1 |
| 2007/0223552 A1 | 9/2007 | Muendel et al. | |
| 2008/0219304 A1 | 9/2008 | Kupershmidt et al. | |

OTHER PUBLICATIONS

International Search Report and Written Opinion issued for PCT/US2010/036150 on Aug. 30, 2010.
Alalusi, M. et al.; "Low Noise Planar External Cavity Laser for Interferometric Fibre Optic Sensors," Fiber Optic Sensors and Applications VI, Proc. of SPIE vol. 7316; 13 pages.
Agrawal, G.P.; "Modulation Performance of a Semiconductor Laser Coupled to an External High-Q Resonator," Feb. 1988, IEEE Journal of Quantum Electronics, vol. 24, No. 2; pp. 134-142.

(Continued)

*Primary Examiner* — Patrick Stafford
*Assistant Examiner* — Tuan Nguyen
(74) *Attorney, Agent, or Firm* — David H. Jaffer; Pillsbury Winthrop Shaw Pittman LLP

(57) ABSTRACT

The present invention relates to external cavity laser (ECL) apparatuses and manufacturing processes, and more particularly to implementing low noise narrow bandwidth ECLs on planar lightwave circuit (PLC) platforms for harnessing high-performance, high-stability operation from a compact-footprint, low-power packaged device. An ECL device with narrow linewidth and low noise is disclosed, the device comprising a PLC device and a gain chip butt-coupled to each other. The PLC device has a planar Bragg grating (PBG) integrated onto a rectangular waveguide. The PLC device has anti-reflection coatings (ARC) on its input facet and output facet. The waveguide is designed to be selective of a single polarization. The gain chip has high-reflection coating (HRC) on a back facet and an ARC on a front facet. An operating wavelength of the ECL is aligned to a longer wavelength red slope of a reflectivity spectrum of the PBG. The operating wavelength may be tuned thermally, electrically, or thermo-electrically.

18 Claims, 5 Drawing Sheets

OTHER PUBLICATIONS

Kazarinov, R.F. et al.; "The Relation of Line Narrowing and Chirp Reduction Resulting from the Coupling of a Semiconductor Laser to a Passive Resonator," Sep. 1987, IEEE Journal of Quantum Electronics, vol. QE-23, No. 9; pp. 1401-1409.

Cartledge, J.C. et al.; "Extraction of DFB Laser Rate Equation Parameters for System Simulation Purposes," May 1997, Journal of Lightwave Technology, vol. 15, No. 5; pp. 852-860.

Bartolo, Robert E. et al., "Achieving Narrow Linewidth, Low Phase Noise External Cavity Semiconductor Lasers through the Reduction of 1/f Noise," Novel In-plan Semiconductor Lasers V, Proc. of SPIE, vol. 6133 (2006); 8 pages.

* cited by examiner

ACHIEVING LOW PHASE NOISE IN EXTERNAL CAVITY LASER IMPLEMENTED USING PLANAR LIGHTWAVE CIRCUIT TECHNOLOGY

CROSS REFERENCE TO RELATED APPLICATION

This application claims priority from U.S. Provisional Patent Application Ser. No. 61/181,183 filed May 26, 2009.

FIELD OF THE INVENTION

The present invention relates to systems and methods of implementing high-performance, high-stability, compact-footprint external cavity lasers.

BACKGROUND

External cavity laser (ECL) technology is a robust solution for achieving interferometric sensing and/or other applications, including, but not limited to, distributed structural monitoring, military surveillance, seismic monitoring, telecommunications, data communications, etc. Traditional bulk-optics-based ECLs are prohibitively large in size, and may not be suitable for applications that require a compact device footprint. Semiconductor-based devices offer the advantage of smaller size and lower power consumption. Compared to other existing semiconductor-based interferometric sensing solutions, such as, systems using Distributed Feedback (DFB) lasers, ECL technology provides significantly narrower linewidth and lower phase noise. Hybrid ECLs based on fiber Bragg gratings (FBGs) may offer comparable narrow linewidth as semiconductor ECLs, but suffer from sensitivity to vibrations, and are relatively expensive to implement. It is to be noted that both waveguide Bragg grating based ECLs (such as the planar devices manufactured by Redfern Integrated Optics, Inc., Santa Clara, Calif., described further herein) and fiber Bragg grating based ECLs are semiconductor-based and hybrid, the difference being the embodiment of the waveguide: planar vs. fiber.

Planar lightwave circuits (PLCs) are photonic devices that are made using at least some of the standard semiconductor batch-fabrication techniques to achieve cost-effective volume production. Semiconducting materials and other structural or functional conducting or non-conducting materials are used to fabricate a planar device that is easy to integrate with other planar photonic or other devices. PLCs are much easier to package using industry-standard packages, such as, a 14-pin butterfly package, typically used for telecommunication devices.

What is needed is a low phase noise narrow linewidth external cavity laser that is compact and less power consuming, manufactured using cost-effective PLC methods, and is less susceptible to environmental variations.

SUMMARY OF THE INVENTION

The present invention relates to external cavity laser (ECL) apparatuses and manufacturing processes, and more particularly to implementing low noise narrow linewidth ECLs on planar lightwave circuit (PLC) platforms for harnessing high-performance, high-stability operation from a compact-footprint, low-power, packaged device.

According to certain aspects of the present invention, an ECL device with narrow line width and low noise is disclosed, the device comprising a PLC device and a gain chip butt-coupled to each other. The PLC device has a planar Bragg grating (PBG) integrated onto a rectangular waveguide. The PLC device has anti-reflection coatings (ARC) on its input facet and output facet. The waveguide is designed to be selective of a single polarization. The gain chip has high-reflection coating (HRC) on a back facet and an ARC on a front facet. An operating wavelength of the ECL may be aligned to a longer wavelength red slope of a reflectivity spectrum of the PBG. The operating wavelength may be tuned thermally, electrically, or thermo-electrically.

According to another aspect of the present invention, the waveguide may be one of a plurality of waveguides disposed side by side in a planar array configuration. Each of the plurality of waveguides may correspond to a respective characteristic wavelength. Each of the plurality of waveguides has a respective PBG characteristic, such that manufacturing variability may be offset by coupling the gain chip with the waveguide that has the desired PBG characteristics.

According to yet another aspect of the present invention, the operating wavelength coincides with a high group delay point, thereby reducing phase noise.

A further aspect of the present invention discloses that the PLC chip is mechanically supported for vibration stabilization.

Yet another aspect of the present invention discloses that the gain chip has a low differential gain to suppress side modes. Furthermore, the gain chip operates at a predominant polarization compared to other existing polarizations. The waveguide butt-coupled to the gain chip is designed to be selective of the predominant polarization of the gain chip.

In furtherance of these and other aspects, a method for making an external cavity laser (ECL) device with narrow line width and low noise is disclosed. The method comprises: integrating a PBG onto a rectangular waveguide in a planar lightwave circuit (PLC) device, wherein the waveguide is designed to be selective of a single polarization; adding anti-reflection coatings (ARC) on an input facet and an output facet of the PLC device; adding a high-reflection coating (HRC) on a back facet of a gain chip, and an ARC on a front facet of the gain chip; and butt-coupling the front facet of the gain chip to the input facet of the PLC device. The method may further comprise setting a operating wavelength of the ECL on a longer wavelength red slope of a reflectivity spectrum of the PBG.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention uses planar Bragg gratings (PBG) on planar lightwave circuit (PLC) platform. PLC platform may be implemented on a standard silica-on-silicon material system, or other material systems. This cavity structure of an ECL implemented on PLC offers a significant reduction in vibration sensitivity over other ECL designs. Furthermore, PBG offers the advantage of high single polarization selectivity by appropriate design.

Figure 1:
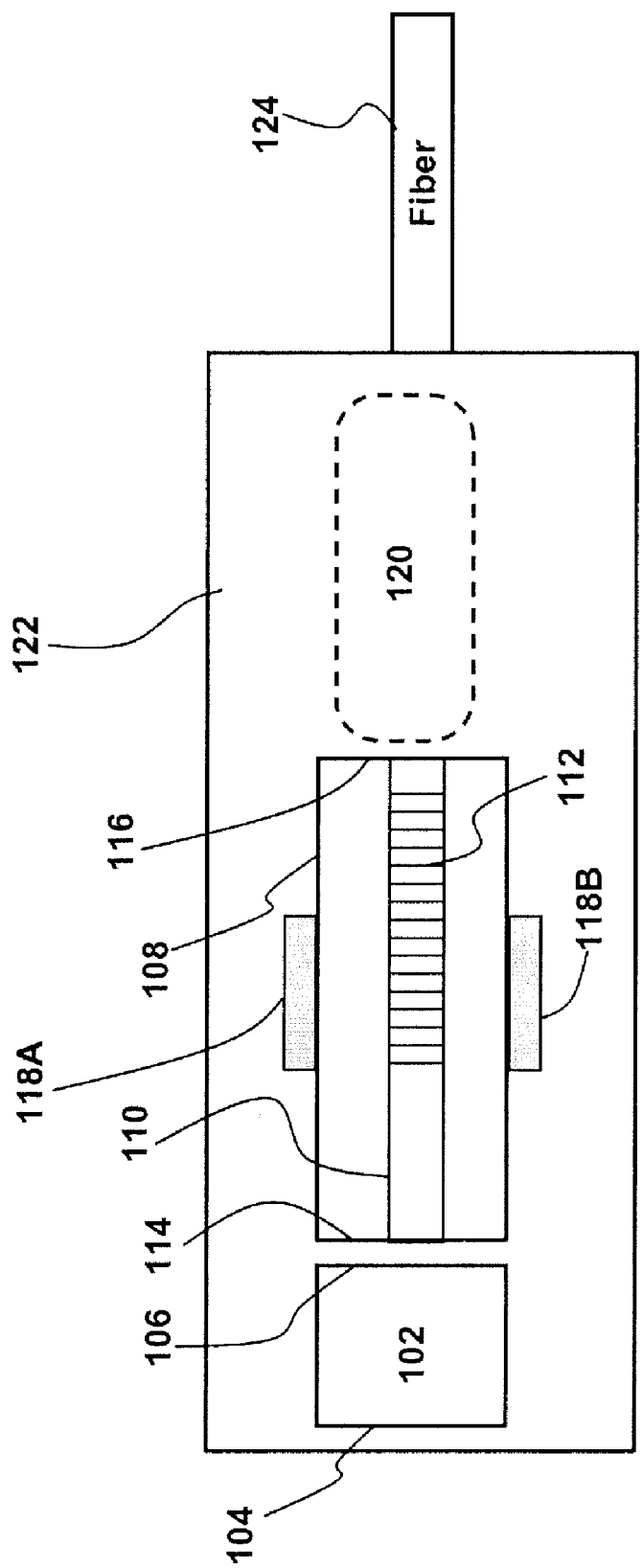
FIG. 1 is an exemplary embodiment of the PLC ECL device, according to the present invention.

A schematic diagram (top view) of a planar ECL device is shown in FIG. 1. The cavity is formed by coupling light between a gain chip 102 with a waveguide 110 of a PLC device 108. PBG 112 is integrated onto the waveguide 110. Characteristics of the PBG will be explained further below. Though for clarity, a small gap is shown between the gain chip 102 and the PLC device 108, in reality, front facet 106 of the gain chip 102 is butt-coupled (optionally using an index-matching glue) to the input facet 114 of the PLC device 108. Back facet 104 of the gain chip 102 may be coated with a high-reflection coating (HRC), while front facet 106 of the gain chip 102 may be coated with an anti-reflection coating (ARC). One or both of the input facet 114 and output facet 116 of the PLC device are also coated with ARC. The material of the gain chip depends on the operating wavelength regime, among other design parameters. For example, for Dense Wavelength Division Multiplexing (DWDM) ECL for sensing or telecommunication application in the 1550 nm wavelength regime, an indium phosphide (InP) gain chip is used. Persons skilled in the art will understand that a particular wavelength regime is not a limiting factor for the scope of the present invention.

In one embodiment of the present invention, mechanical structures, such as rectangular posts 118A and 118B are included to support the PLC device 108, resulting in less sensitivity to vibrations and other structural instabilities.

The gain chip 102 and the PLC device 108 are mounted on a package 122. Package 122 may be a standard 14-pin butterfly package, or other standard or customized packages, depending on the application. Optionally, coupling optics (e.g., lens), isolator etc. may be included in the package downstream from the PLC device 108, as schematically shown as a lumped coupling element 120. Element 120 should have low return loss. For a fiber-pigtailed device, a low return loss fiber stub 124 may be integrated to the package 122. In alternative embodiments, a fiber may be externally connected to the package 122. In wavelength regimes that are not dependent on fiber, such as free-space optical regime, a collimating optics may replace the fiber stub 124. Persons skilled in the art will understand that these examples are for illustrative purposes only.

One or more thermoelectric cooler (TEC) may be included in the package 122, such that, one or more of the PLC device 108 and the gain chip 102 are mounted on top of the TEC (not shown in FIG. 1). In one example, the entire cavity, gain chip (GC) and PLC may be integrated into a single platform that resides on a single TEC to achieve environmental and operational point stability.

In one embodiment, gain chip 102's output waveguide is tapered for mode size conversion. The mode field diameter at the end of the taper, i.e., at front facet 106 is approximately same as the mode field diameter of the PLC device 108 at the input facet 114. The planar lightwave circuit (PLC) waveguide 110's cross-section may be optimized too for even higher coupling efficiency with the gain chip 102 at the input end, and/or high coupling efficiency with the fiber 124 at the output end.

Figure 2:
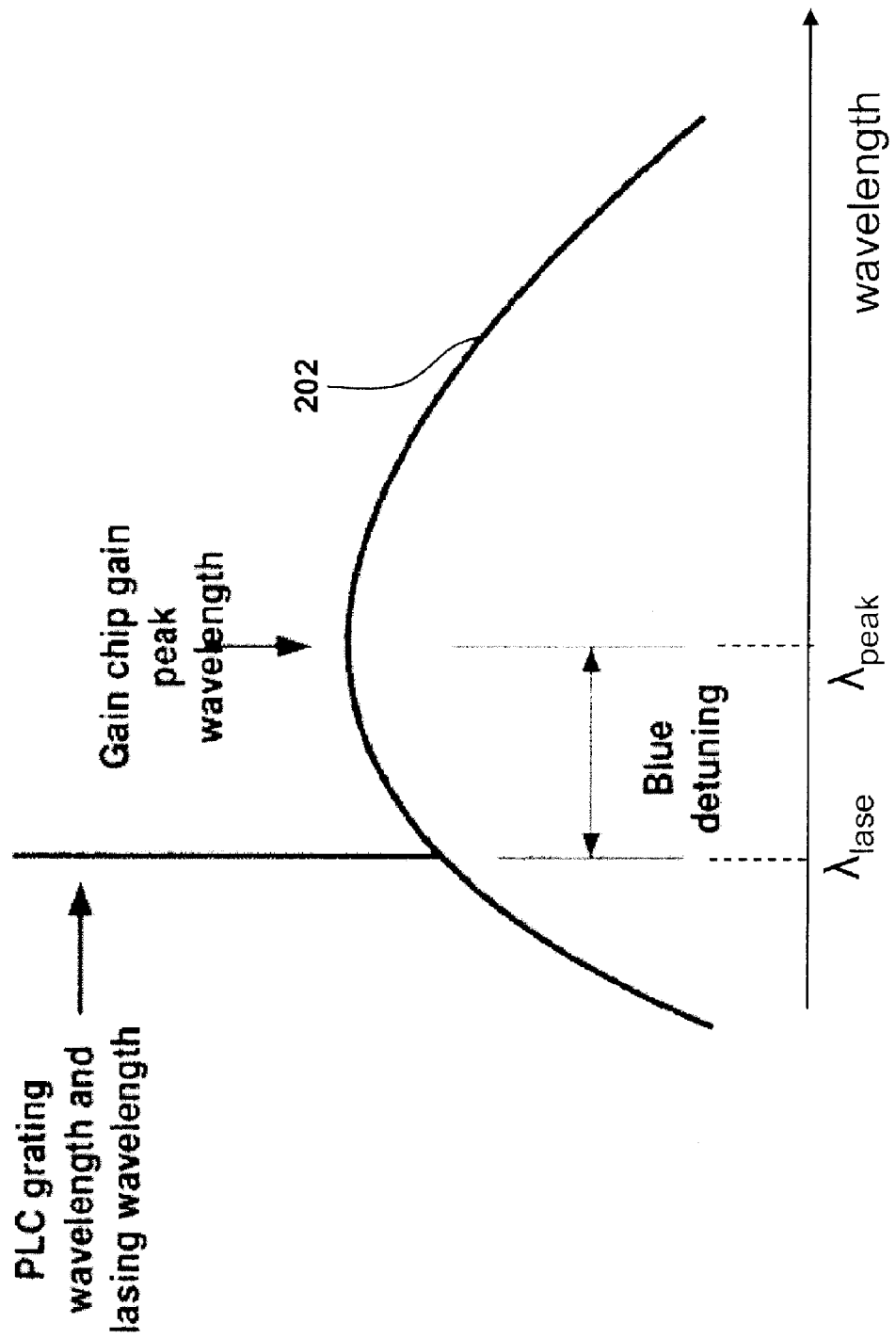
FIG. 2 shows relationship of a lasing wavelength with the peak wavelength of the gain chip, according to an embodiment of the present invention.

The gain chip 102 is be designed with controlled or optimized differential gain to suppress side modes and reduce cavity phase noise. Relatively low differential gain is better for these purposes. Using small number of quantum wells and optimizing blocking layers in the gain chip design ensure low differential gain. As shown in FIG. 2, blue detuning is used to the designer's advantage by controlling the parameters of the PLC device, specifically, controlling the PBG characteristics, so that the lasing wavelength $\lambda_{lase}$ is not coinciding with the exact peak wavelength $\lambda_{peak}$ of the gain chip gain curve 202, but is blue shifted towards a lower wavelength $\lambda_{lase}$ for reduction of noise.

Another characteristic of the gain chip 102 is that it may be designed to exhibit a predominant polarization. The PLC waveguide 110 is designed to be highly selective of the predominant polarization of the gain chip 102. For example, in one embodiment, TE (transverse electric) may be the predominant polarization of the gain chip 102 with a TE-to-TM (transverse magnetic) ratio greater than 40 dB. The PLC rectangular waveguide 110 is designed to have inherently high single polarization selectivity. Therefore, the entire laser cavity will support only single polarization, which happens to be TE polarization in the example shown. A single mode fiber (SMF) or a polarization maintaining fiber (PMF) is coupled to the PLC to preserve the polarization selectivity.

Though in FIG. 1, only one waveguide 110 is shown in the PLC device 108, in one example embodiment, the PLC device 108 may have an array of waveguides disposed laterally in parallel to one another, each having different characteristic wavelengths to achieve precise lasing wavelength control, and to offset manufacturing variability.

As shown in FIG. 1, the combination of gain chip 102 and PBG 112 on PLC 108 forms a distributed Bragg reflector (DBR) ECL laser. The DBR ECL laser is designed such that it will operate in a single mode on the red side (longer wavelength) of the grating.

The theoretical background of external cavity laser with a dipersive mirror has been outlined in various references. For example, interested readers are encouraged to review "The relation of line narrowing and chirp reduction resulting from the coupling of a semiconductor laser to a passive resonator," by Kazarinov and Henry in *IEEE J. of Quantum Electron.* QE-23: 1401-1409, (1987), and "Modulation performance of a semiconductor laser coupled to an external high-Q resonator," by Agrawal and Henry, *IEEE. J. of Quantum Electron.* QE-24: 134-142, (1988). It was shown that larger negative slope in the reflectivity spectrum of a dispersive mirror and larger group delay result in lowering phase noise. However, the slope is believed to have a higher impact than the effect of group delay.

With this theoretical basis in mind, The PLC grating, i.e., the PBG 112, is designed with features, including, but not limited to, the following:

Asymmetrical side lobes on both sides of the high-reflectivity window in the reflectivity spectrum of the grating to suppress side modes and achieve high slope;

High red side (i.e. longer wavelength) slope to reduce phase noise;

High reflectivity to achieve high slope and optimum cavity stability;

Small reflectivity bandwidth to achieve single mode operation, and suppression of side modes;

High core/cladding refractive index contrast in the PLC waveguide 110 to achieve high coupling efficiency with semiconductor gain chip 102 and desired grating effect of wavelength selectivity.

Figure 3:
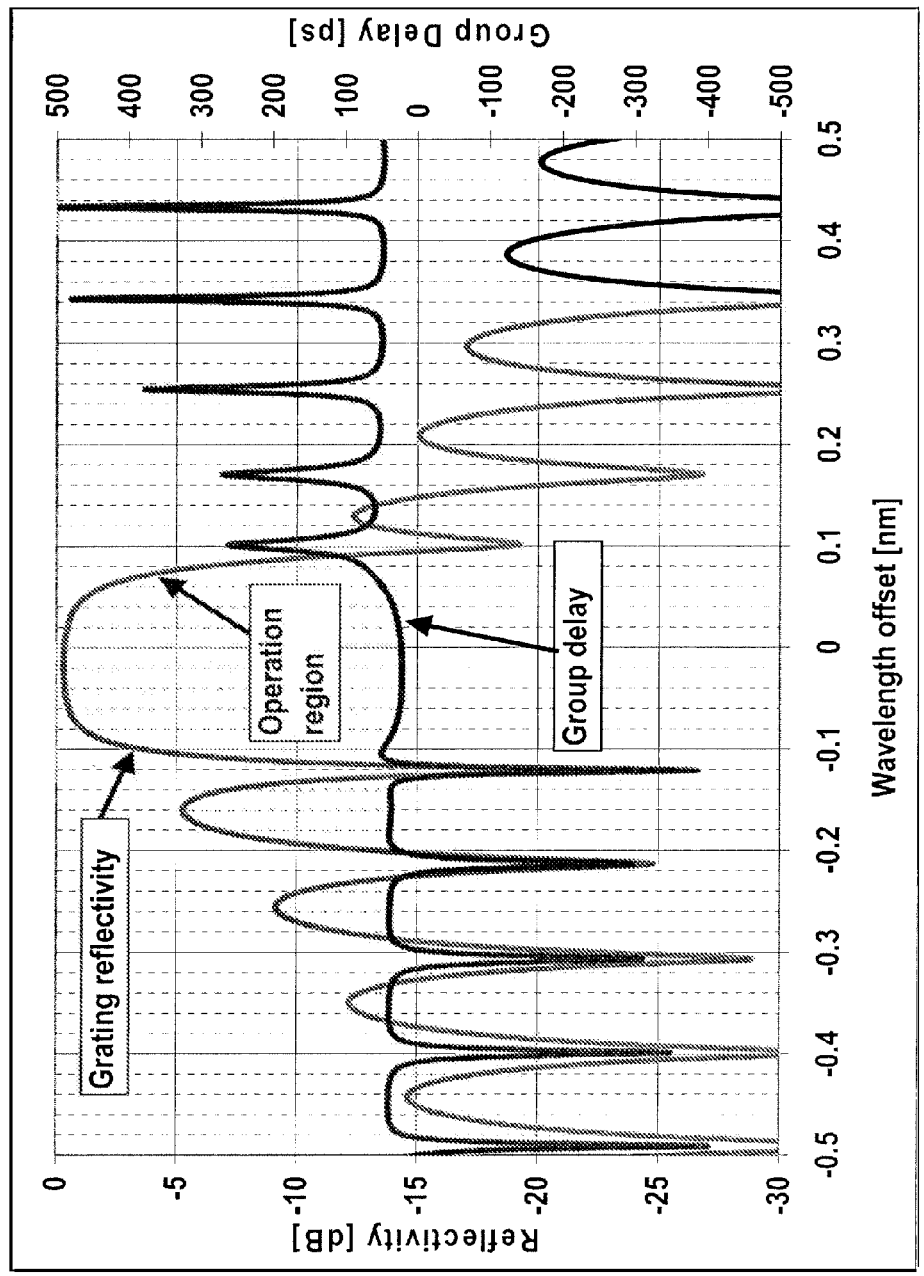
FIG. 3 graphically shows means of achieving low noise by coinciding the operating wavelength at a point where group delay is relatively high, according to an aspect of the present invention.

FIG. 3 superimposes two curves, a grating reflectivity curve of the PBG and a group delay curve, both plotted against a wavelength offset. The ECL is designed to operate at the red side slope of the PBG, as shown in FIG. 3. Operating at the red side of the grating reflectivity curve results in:

Reduction of phase noise due to the large negative slope, which acts as feedback mechanism to minimize wavelength variation;

Coinciding with a high group delay point, which further decreases the phase noise.

Using current and temperature as controlling parameters (used singly or in combination), the laser cavity can be tuned to operate at the maximum grating slope while achieving a desired wavelength. As discussed before, a gain chip with low differential gain is also important to tune to maximum slope while maintaining single mode operation with high side mode suppression ratio (SMSR).

Figure 4:
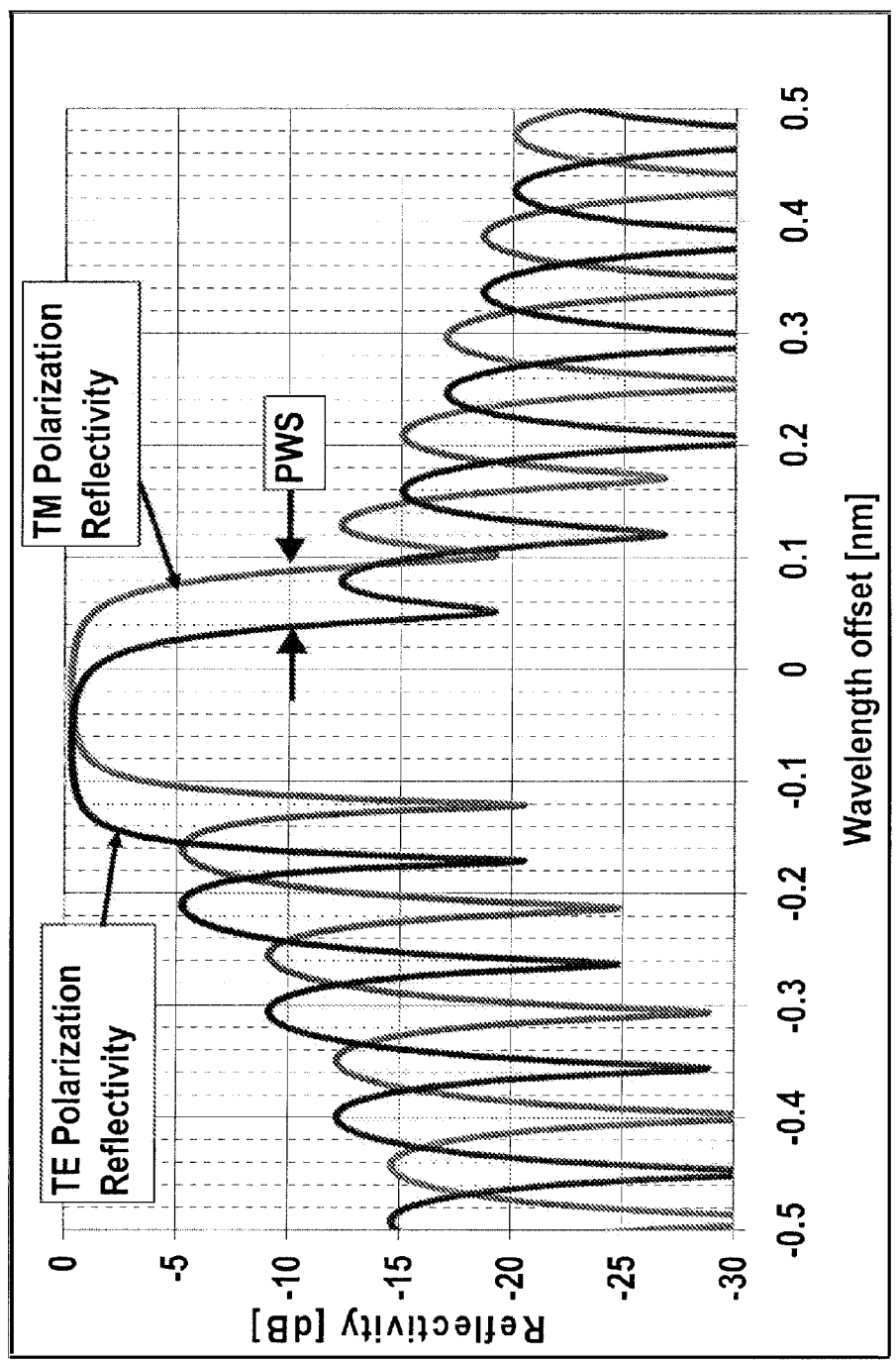
FIG. 4 graphically illustrates polarization dependence of the grating reflectivity, which is utilized as a design aspect in the present invention.

FIG. 4 shows polarization selectivity of a typical PBG. FIG. 4 shows TE polarization reflectivity and TM polarization reflectivity curves superimposed. FIG. 4 shows a polarization wavelength shift (PWS) between the two polarizations. As discussed before, the gain chip 102 and the PLC waveguide 110 are both optimized for TE operation.

To summarize the various design optimizations as discussed above, it has been established that in order for the cavity to operate in a single longitudinal mode with high side mode suppression ratio (SMSR), a PLC grating with high red side lobe suppression ratio is needed, as shown in FIG. 3 in addition to ARC on the facets. However, this does not guarantee operation at the maximum grating slope and single mode operation with high SMSR. If the gain chip 102 differential gain is not low enough, it is not possible to operate at the maximum slope without degrading the SMSR. Lower SMSR results in higher phase noise. Therefore differential gain control of the gain chip 102 becomes very important as well.

Figure 5:
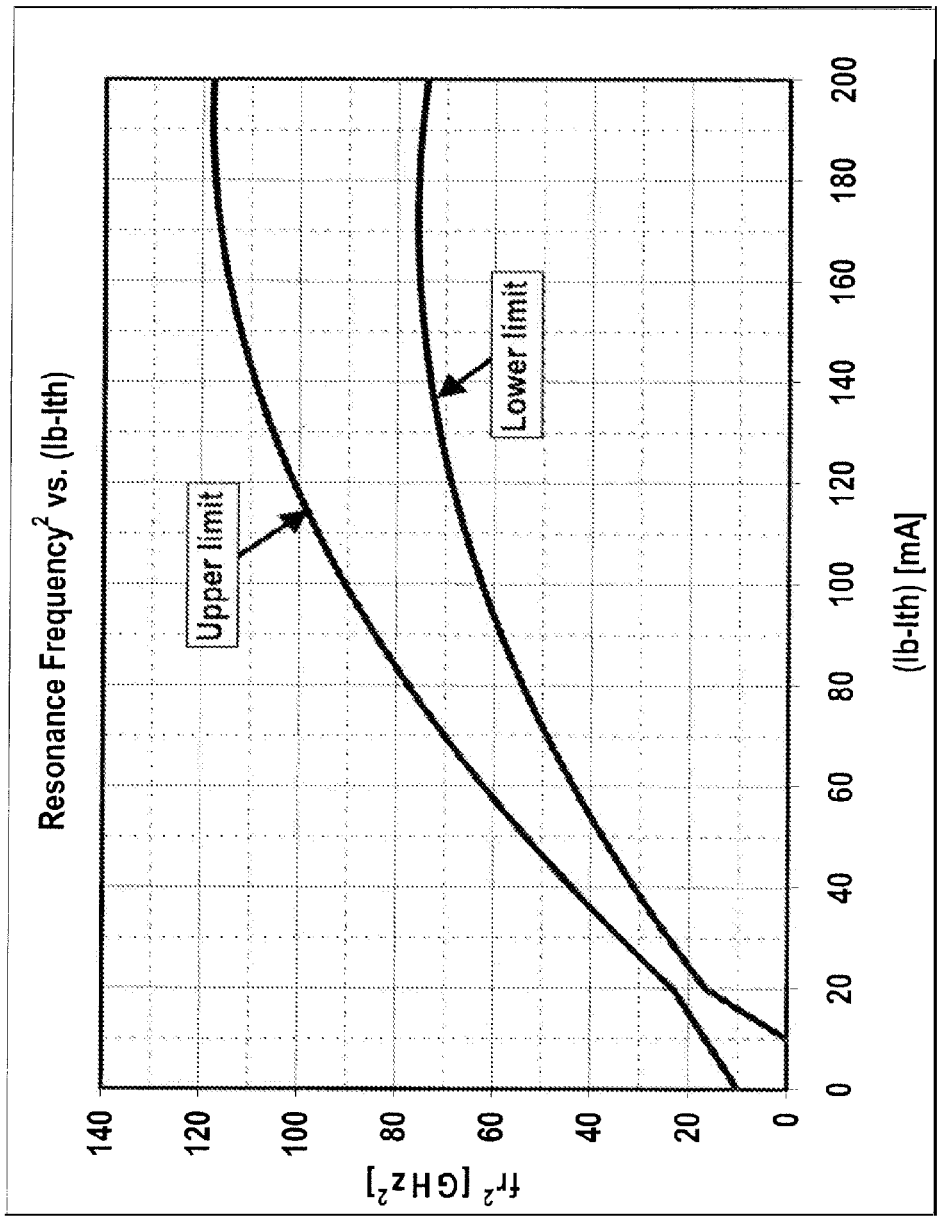
FIG. 5 graphically depicts resonance frequency squared plotted against the difference between a bias current and a threshold current, as a metric for quantifying differential gain, according to an embodiment of the present invention.

A measure of differential gain of a gain chip can be found from a gain chip resonance frequency squared ($fr^2$), plotted against a difference between a bias current ($I_b$) and a threshold current ($I_{th}$). This technique has been described in an article by Cartledge and Srinivasan, titled, "Extraction of DFB Laser Rate Equation Parameters for System Simulation Purposes," in IEEE J. of Lightwave Technology JLT-15: 852-860, (1997). FIG. 5 shows such a plot for an example gain chip 102 with cleaved uncoated facets. Lower $fr^2$ in this curve means lower differential gain, which is beneficial for the present invention.

Finally, as discussed in the background section, there are other laser technologies that offer low phase noise, such as FBG based external cavity and fiber lasers. This invention offers advantages at least in the following aspects:

Less sensitive to vibrations compared to FBG based external cavity and fiber lasers;

Better reliability than fiber lasers;

Lower power consumption than fiber laser;

Better frequency (wavelength) stability than FBG based external cavity and fiber lasers;

Lower relative intensity noise (RIN) at low frequencies compared to fiber laser, leading to higher operational stability.

The descriptions above are intended to be illustrative, not limiting. Thus, it will be apparent to one skilled in the art that modifications may be made to the invention as described without departing from the scope of the claims set out below.

What is claimed is:

1. An external cavity laser (ECL) device with narrow linewidth and low noise, comprising:

a planar lightwave circuit (PLC) device with a planar Bragg grating (PBG) integrated onto a rectangular waveguide, wherein the PLC device has anti-reflection coatings (ARC) on an input facet and an output facet, and wherein the waveguide is designed to be selective of a single polarization; and a gain chip having a high-reflection coating (HRC) on a back facet and an ARC on a front facet, wherein the front facet of the gain chip is butt-coupled to the input facet of the PLC device, wherein an operating wavelength of the ECL is aligned to a longer wavelength negative red slope of a reflectivity spectrum of the PBG, such that both the negative red slope and a group delay have respective high values at the operating wavelength region, thereby achieving low phase noise for the ECL; wherein the gain chip has a low differential gain to suppress side modes.

2. The device of claim 1, wherein a cross section of the rectangular waveguide is optimized for efficient coupling with the gain chip.

3. The device of claim 1, wherein a waveguide in the gain chip is tapered for efficient coupling with the PLC device.

4. The device of claim 1, wherein the waveguide is one of a plurality of waveguides disposed side by side in a planar array.

5. The device of claim 4, wherein each of the plurality of waveguides corresponds to a respective characteristic wavelength, from which the operating wavelength can be chosen.

6. The device of claim 4, wherein each of the plurality of waveguides has a respective characteristic wavelength dependent on respective PBG properties, such that manufacturing variability is offset by coupling the gain chip with the waveguide that has the desired PBG properties.

7. The device of claim 1, wherein the operating wavelength is tuned thermally, electrically, or thermoelectrically.

8. The device of claim 1, wherein the PLC device is mechanically supported for vibration stabilization.

9. The device of claim 1, wherein the gain chip operates at a predominant polarization compared to other existing polarizations.

10. The device of claim 9, wherein the waveguide is designed to be selective of the predominant polarization of the gain chip.

11. The device of claim 1, wherein the reflectivity spectrum of the PBG is designed to have asymmetrical side lobes.

12. The device of claim 11, wherein the reflectivity spectrum of the PBG has a narrow high-reflectivity bandwidth.

13. The device of claim 1, wherein the ECL device is packaged into a standard 14-pin butterfly package.

14. The device of claim 13, wherein output of the ECL is coupled into a fiber that maintains the polarization mode of the PLC device.

15. A method for making an external cavity laser (ECL) device with narrow linewidth and low noise, the method comprising:
integrating a planar Bragg grating (PBG) onto a rectangular waveguide in a planar lightwave circuit (PLC) device, wherein the waveguide is designed to be selective of a single polarization;
adding anti-reflection coatings (ARC) on an input facet and an output facet of the PLC device;
adding a high-reflection coating (HRC) on a back facet of a gain chip, and an ARC on a front facet of the gain chip; and
butt-coupling the front facet of the gain chip to the input facet of the PLC device and wherein an operating wavelength of the ECL is aligned to a longer wavelength negative red slope of a reflectivity spectrum of the PBG, such that both the negative red slope and a group delay have respective high values at the operating wavelength region, thereby achieving low phase noise for the ECL; wherein the gain chip has a low differential gain to suppress side modes.

16. An external cavity laser (ECL) device with narrow linewidth and low noise, comprising:
a planar lightwave circuit (PLC) device comprising an array of waveguides disposed laterally in parallel to one another, each waveguide having an integrated planar Bragg grating (PBG) corresponding to a respective characteristic wavelength, wherein the PLC device has anti-reflection coatings (ARC) on an input facet and an output facet; and
a gain chip having a high-reflection coating (HRC) on a back facet and an ARC on a front facet, wherein the front facet of the gain chip is butt-coupled to the input facet of the PLC device,
wherein an operating wavelength of the ECL, chosen from the characteristic wavelengths of the integrated PBGs of the array of waveguides, is aligned to a longer wavelength negative red slope of a reflectivity spectrum of the PBG of the selected waveguide, such that both the negative red slope and a group delay have respective high values at the operating wavelength region, thereby achieving low phase noise for the ECL; wherein the gain chip has a low differential gain to suppress side modes.

17. The device of claim 16, wherein manufacturing variability of at least one of the waveguides and the corresponding PBGs is offset by coupling the gain chip with the waveguide that has the desired parameters.

18. The device of claim 16, wherein one or more properties of the PBG of a particular waveguide from the array of waveguides are tuned to a desired operating condition.

* * * * *